US009310680B2

(12) United States Patent
Ito et al.

(10) Patent No.: US 9,310,680 B2
(45) Date of Patent: Apr. 12, 2016

(54) PHOTOCURABLE/THERMOSETTING RESIN COMPOSITION

(75) Inventors: Nobuhito Ito, Saitama (JP); Masao Arima, Saitama (JP)

(73) Assignee: TAIYO INK MFG. CO., LTD., Saitama (JP)

( * ) Notice: Subject to any disclaimer, the term of this patent is extended or adjusted under 35 U.S.C. 154(b) by 79 days.

(21) Appl. No.: 14/127,078

(22) PCT Filed: Jun. 15, 2012

(86) PCT No.: PCT/JP2012/065404
§ 371 (c)(1),
(2), (4) Date: Dec. 17, 2013

(87) PCT Pub. No.: WO2012/173242
PCT Pub. Date: Dec. 20, 2012

(65) Prior Publication Data
US 2014/0147776 A1     May 29, 2014

(30) Foreign Application Priority Data

Jun. 17, 2011   (JP) ................................. 2011-134736

(51) Int. Cl.
| | |
|---|---|
| *B32B 27/38* | (2006.01) |
| *B32B 27/42* | (2006.01) |
| *C08L 61/14* | (2006.01) |
| *C08L 63/10* | (2006.01) |
| *H05K 1/09* | (2006.01) |
| *G03F 7/038* | (2006.01) |
| *H05K 3/28* | (2006.01) |
| *C08F 287/00* | (2006.01) |

(52) U.S. Cl.
CPC .............. *G03F 7/0384* (2013.01); *B32B 27/38* (2013.01); *B32B 27/42* (2013.01); *C08F 287/00* (2013.01); *C08L 61/14* (2013.01); *C08L 63/10* (2013.01); *G03F 7/038* (2013.01); *G03F 7/0388* (2013.01); *H05K 3/287* (2013.01); *H05K 2201/0166* (2013.01)

(58) Field of Classification Search
None
See application file for complete search history.

(56) References Cited

U.S. PATENT DOCUMENTS

| | | | |
|---|---|---|---|
| 6,583,198 B2 * | 6/2003 | Sato et al. ..................... 522/100 |
| 9,075,307 B2 * | 7/2015 | Kurafuchi ............. G03F 7/0388 |
| 2006/0141381 A1 * | 6/2006 | Yoshino et al. ............ 430/270.1 |
| 2009/0087775 A1 | 4/2009 | Kunou et al. |
| 2011/0223539 A1 * | 9/2011 | Kurafuchi et al. ......... 430/280.1 |
| 2011/0278049 A1 | 11/2011 | Kim et al. |
| 2012/0168215 A1 * | 7/2012 | Shiina et al. .................. 174/258 |

FOREIGN PATENT DOCUMENTS

| | | | |
|---|---|---|---|
| CN | 101105628 A | | 1/2008 |
| CN | 101105629 A | | 1/2008 |
| JP | 61 243869 | | 10/1986 |
| JP | 3 119014 | | 5/1991 |
| JP | 3 250012 | | 11/1991 |
| JP | 8 339084 | | 12/1996 |
| JP | 2006 317924 | | 11/2006 |
| JP | 2006-317924 A | * | 11/2006 |
| JP | 2007 199135 | | 8/2007 |
| JP | 2009 102623 | | 5/2009 |
| JP | 2011 52130 | | 3/2011 |
| JP | 2011 65087 | | 3/2011 |
| TW | 201042387 A1 | | 12/2010 |
| TW | 201105695 A1 | | 2/2011 |
| TW | 201120570 A1 | | 6/2011 |
| WO | WO 2011/027526 A1 | * | 3/2011 |

OTHER PUBLICATIONS

Chemical Book, Methacryloyl Oxyethyl Dimethylbenzyl Ammonium Chloride, 2010, two pages.*
BASF, N,N-Dimethylaminoethyl Methacrylate, Dec. 2011, three pages.*
Combined Taiwanese Office Action and Search Report issued Mar. 4, 2014 in Patent Application No. 101121746 with partial English language translation.
International Search Report Issued Sep. 11, 2012 in PCT/JP12/065404 Filed Jun. 15, 2012.

* cited by examiner

*Primary Examiner* — Robert Sellers
(74) *Attorney, Agent, or Firm* — Oblon, McClelland, Maier & Neustadt, L.L.P.

(57) ABSTRACT

Provided is an alkali-developable photocurable/thermosetting resin composition from which a cured coating film that has excellent thermal shock resistance and exhibits excellent PCT resistance, HAST resistance and electroless gold plating resistance, which are important as a solder resist for semiconductor packages, can be formed. The alkali-developable photocurable/thermosetting resin composition is characterized by comprising (A) a carboxyl group-containing photosensitive resin, (B) a photopolymerization initiator, (C) a block copolymer and (D) a thermosetting component.

20 Claims, No Drawings

PHOTOCURABLE/THERMOSETTING RESIN COMPOSITION

TECHNICAL FIELD

The present invention relates to a photocurable/thermosetting resin composition, a dry film, a cured product and a printed wiring board. More specifically, the present invention relates to a photocurable/thermosetting resin composition which is suitable for a solder resist of a printed wiring board and the like, particularly a resist for an IC package.

BACKGROUND ART

At present, in the solder resists of consumer and industrial printed wiring boards, from the standpoint of attaining high precision and high density, liquid developing-type photosolder resists that are, upon being irradiated with ultraviolet light, developed to form an image and then subjected to final curing (main curing) by heating and/or irradiation with a light are used. Further, in response to hight densification of printed wiring boards in association with miniaturization of electronic devices, there is a demand for a solder resist having an improved workability and high performance.

Among such liquid developing-type solder resists, in consideration of environmental problems, it is the prevailing trend to use an alkali developing-type solder resist which utilizes a dilute aqueous alkaline solution as its developing solution, and such an alkali developing-type solder resist is being used in a large amount in the actual production of printed wiring board. As such an alkali developing-type photosolder resist, an epoxy acrylate-modified resin derived by modification of an epoxy resin has been commonly used.

For example, Patent Document 1 discloses a solder resist composition which comprises: a photosensitive resin obtained by adding an acid anhydride to a reaction product of a novolac-type epoxy compound and an unsaturated monobasic acid; a photopolymerization initiator; a diluent; and an epoxy compound. Patent Document 2 discloses a solder resist composition comprising: a photosensitive resin obtained by adding (meth)acrylic acid to an epoxy resin, which is produced by allowing a reaction product of salicyl aldehyde and monohydric phenol to react with epichlorohydrin, and further allowing the resultant to react with a polybasic carboxylic acid or an anhydride thereof; a photopolymerization inhibitor; an organic solvent; and the like.

RELATED ART DOCUMENTS

Patent Documents

Patent Document 1: Japanese Unexamined Patent Application Publication No. S61-243869 (Claims)
Patent Document 2: Japanese Unexamined Patent Application Publication No. H3-250012 (Claims)

SUMMARY OF THE INVENTION

Problems to be Solved by the Invention

However, as compared to conventional thermosetting-type and solvent developable-type photosolder resists, conventional alkali developing-type photosolder resists may not always be sufficient in terms of the durability such as alkali resistance, water resistance and heat resistance. For example, in conventional alkali developing-type photosolder resists, there are cases where a crack is generated on the coating film due to thermal shock and/or the coating film is detached from the substrate and sealing material; therefore, improvements are demanded in that respect. This problem is believed to be attributable to that a main component of an alkali developing-type photosolder resist contains a hydrophilic group for providing alkali developability and this hydrophilic group may induce infiltration of a chemical solution, water, steam or the like into the cured product to cause deterioration in the chemical resistance, such as alkali resistance, and the adhesion between the resist coating film and copper.

Particularly, in semiconductor packages such as BGA (Ball Grid Array) and CSP (Chip Scale Package), a high resistance to moist heat is demanded; however, reviewing the values that were obtained by PCT test (Pressure Cooker Test) performed under a high-humidity and high-temperature condition and HAST test (Highly Accelerated Stress Test) performed with an application of a voltage under a high-temperature humidified condition, the existing alkali developing-type photosolder resists are considered to still have room for improvement.

Furthermore, due to, for example, the use of a lead-free solder in association with the transfer to surface mounting and consideration of environmental problems, the temperature inside and outside the package tends to reach a remarkably high level. In reflection of this, problems of deterioration, change in the properties and occurrence of detachment of the coating film that are caused by thermal history have increasingly surfaced and, therefore, there is a demand for a further improvement in the durability of an alkali developing-type photosolder resist such as PCT resistance and HAST resistance.

In view of the above, an object of the present invention is to provide an alkali-developable photocurable/thermosetting resin composition from which a cured coating film that has excellent thermal shock resistance and exhibits excellent PCT resistance, HAST resistance and electroless gold plating resistance, which are important as a solder resist for semiconductor packages, can be formed.

Another object of the present invention is to provide a dry film and a cured product that are obtained by using such photocurable/thermosetting resin composition and excellent in the above-described various properties, as well as a printed wiring board on which a cured coating film such as a solder resist is formed from the dry film or the cured product.

Means for Solving the Problems

That is, the alkali-developable photocurable/thermosetting resin composition according to the present invention is characterized by comprising (A) a carboxyl group-containing photosensitive resin, (B) a photopolymerization initiator, (C) a block copolymer and (D) a thermosetting component.

It is preferred that the alkali-developable photocurable/thermosetting resin composition according to the present invention comprise an epoxy resin as the above-described component (D).

Further, in the alkali-developable photocurable/thermosetting resin composition according to the present invention, it is preferred that the above-described component (A) be obtained without using an epoxy resin as a starting material.

Further, in the alkali-developable photocurable/thermosetting resin composition according to the present invention, it is preferred that the above-described component (A) contain no hydroxyl group.

Further, in the alkali-developable photocurable/thermosetting resin composition according to the present invention, it is preferred that the above-described component (A) be obtained by allowing a resin, which is produced by converting some or all of phenolic hydroxyl groups of a phenol resin to oxyalkyl groups having an alcoholic hydroxyl group, to react with an α,β-ethylenically unsaturated group-containing monocarboxylic acid and further allowing the resulting reaction product to react with a polybasic acid anhydride.

Further, in the alkali-developable photocurable/thermosetting resin composition according to the present invention, it is preferred that the above-described (C) block copolymer be a block copolymer represented by the following Formula (I):

A-B-A    (I)

(wherein, A represents a polymer unit having a glass transition temperature, Tg, of 0° C. or higher; and B represents a polymer unit having a glass transition temperature, Tg, of lower than 0° C.).

Further, in the alkali-developable photocurable/thermosetting resin composition according to the present invention, it is preferred that the above-described (C) block copolymer be a block copolymer of the above-described Formula (I), wherein A is polystyrene, polyglycidyl methacrylate, N-substituted polyacrylamide, polymethyl methacrylate, or a carboxylic acid-modified product or hydrophilic group-modified product thereof; and B is polybutyl acrylate or polybutadiene.

The photocurable/thermosetting dry film according to the present invention is characterized in that it is obtained by coating and drying the above-described photocurable/thermosetting resin composition on a carrier film.

The cured product according to the present invention is characterized in that it is obtained by curing the above-described photocurable/thermosetting resin composition or photocurable/thermosetting dry film by irradiation with an active energy beam and/or heating.

The printed wiring board according to the present invention is characterized by comprising the above-described cured product.

Effects of the Invention

According to the present invention, an alkali-developable photocurable/thermosetting resin composition which is capable of forming a cured coating film having excellent thermal shock resistance, PCT resistance, HAST resistance and electroless gold plating resistance can be provided.

MODE FOR CARRYING OUT THE INVENTION

The alkali-developable photocurable/thermosetting resin composition according to the present invention (hereinafter, also referred to as "the photocurable resin composition") is characterized by comprising (A) a carboxyl group-containing photosensitive resin, (B) a photopolymerization initiator, (C) a block copolymer and (D) a thermosetting component.

The constituents of the photocurable resin composition according to the present invention will now each be described in detail.

[(A) Carboxyl Group-Containing Resin]

As the above-described (A) carboxyl group-containing resin, a known carboxyl group-containing resin can be used. The presence of a carboxyl group can make the resin composition developable with an alkali. Further, from the standpoints of the photocurability and development resistance, it is preferred that the (A) carboxyl group-containing resin have an ethylenically unsaturated double bond along with a carboxyl group in the molecule; however, as the component (A), a carboxyl group-containing resin which has no ethylenically unsaturated double bond may be used alone as well. In cases where a resin having no ethylenically unsaturated bond is used alone as the component (A), in order to impart the composition with photocurability, it is required that a compound having at least one ethylenically unsaturated group in the molecule (photopolymerizable monomer) be used in combination. The ethylenically unsaturated double bond is preferably originated from acrylic acid, methacrylic acid or a derivative thereof.

Further, as the component (A), a carboxyl group-containing resin in which an epoxy resin is not used as a starting material is preferably employed. Such a carboxyl group-containing resin in which an epoxy resin is not used as a starting material contains very small amount of halide ion; therefore, deterioration of the insulation reliability can be inhibited.

Specific examples of the carboxyl group-containing resin that can be used in the photocurable resin composition according to the present invention include the following compounds (that may each be either an oligomer or a polymer).

(1) A carboxyl group-containing photosensitive resin obtained by allowing the below-described polyfunctional (solid) epoxy resin, which has two or more functional groups, to react with (meth)acrylic acid and then adding a dibasic acid anhydride, such as phthalic anhydride, tetrahydrophthalic anhydride or hexahydrophthalic anhydride, to a hydroxyl group existing in the side chain of the resultant;

(2) A carboxyl group-containing photosensitive resin obtained by allowing a polyfunctional epoxy resin, which is obtained by further epoxidizing a hydroxyl group of the below-described bifunctional (solid) epoxy resin with epichlorohydrin, to react with (meth)acrylic acid and then adding a dibasic acid anhydride to the resulting hydroxyl group;

(3) A carboxyl group-containing photosensitive resin which is obtained by allowing an epoxy compound having a plurality of epoxy groups in one molecule to react with a compound having at least one alcoholic hydroxyl group and one phenolic hydroxyl group in one molecule and an unsaturated group-containing monocarboxylic acid such as (meth)acrylic acid and then further allowing the alcoholic hydroxyl group(s) of the resulting reaction product to react with a polybasic acid anhydride such as maleic anhydride, tetrahydrophthalic anhydride, trimellitic anhydride, pyromellitic anhydride or adipic acid;

(4) A carboxyl group-containing photosensitive resin which is obtained by allowing a reaction product between a compound having a plurality of phenolic hydroxyl groups in one molecule (e.g., bisphenol A, bisphenol F, bisphenol S, a novolac-type phenol resin, poly-p-hydroxystyrene, a condensation product of naphthol and an aldehyde, or a condensation product of dihydroxynaphthalene and an aldehyde) and an alkylene oxide (e.g., ethylene oxide or propylene oxide) to react with an unsaturated group-containing monocarboxylic acid such as (meth)acrylic acid and then further allowing the resulting reaction product to react with a polybasic acid anhydride;

(5) A carboxyl group-containing photosensitive resin which is obtained by allowing a reaction product between a compound having a plurality of phenolic hydroxyl groups in one molecule and a cyclic carbonate compound such as ethylene carbonate or propylene carbonate to react with an unsaturated group-containing monocarboxylic acid and then further allowing the resulting reaction product to react with a polybasic acid anhydride;

(6) A terminal carboxyl group-containing urethane resin obtained by allowing an urethane resin terminal, which is generated by a polyaddition reaction between a diisocyanate compound (e.g., an aliphatic diisocyanate, a branched aliphatic diisocyanate, an alicyclic diisocyanate or an aromatic diisocyanate) and a diol compound (e.g., a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group), to react with an acid anhydride;

(7) A carboxyl group-containing urethane resin having a (meth)acrylated terminal, which is obtained by adding a compound having one hydroxyl group and at least one (meth) acryloyl group in the molecule, such as hydroxyalkyl (meth) acrylate, during the synthesis of a carboxyl group-containing urethane resin by a polyaddition reaction of a diisocyanate, a carboxyl group-containing dialcohol compound (e.g. dimethylol propionic acid or dimethylol butanoic acid) and a diol compound;

(8) A carboxyl group-containing urethane resin having a (meth)acrylated terminal, which is obtained by adding a compound having one isocyanate group and at least one (meth) acryloyl group in the molecule, such as an equimolar reaction product of isophorone diisocyanate and pentaerythritol triacrylate, during the synthesis of a carboxyl group-containing urethane resin by a polyaddition reaction of a diisocyanate, a carboxyl group-containing dialcohol compound and a diol compound;

(9) A carboxyl group-containing resin which is obtained by copolymerization of an unsaturated carboxylic acid, such as (meth)acrylic acid, and an unsaturated group-containing compound such as styrene, α-methylstyrene, a lower alkyl (meth)acrylate or isobutylene;

(10) A carboxyl group-containing photosensitive resin which is obtained by further adding a compound having one epoxy group and at least one (meth)acryloyl group in one molecule, such as glycidyl (meth)acrylate or α-methylglycidyl (meth)acrylate, to a carboxyl group-containing polyester resin obtained by allowing the below-described polyfunctional oxetane resin to react with a dicarboxylic acid such as adipic acid, phthalic acid or hexahydrophthalic acid and then adding a dibasic acid anhydride to the resulting primary hydroxyl group; and

(11) A carboxyl group-containing photosensitive resin which is obtained by further adding a compound having a cyclic ether group and a (meth)acryloyl group in one molecule to any one of the carboxyl group-containing resins described in the above (1) to (10).

It is noted here that the term "(meth)acrylate" used herein is a general term for acrylates, methacrylates and mixtures thereof, and this is hereinafter applicable to all similar expressions.

Among these carboxyl group-containing resins, as described in the above, one in which an epoxy resin is not used as a starting material can be suitably employed. Therefore, among the above-described specific examples of the carboxyl group-containing resin, at least one of the carboxyl group-containing resins according to (4) to (8) can be particularly suitably employed.

By not using an epoxy resin as a starting material in this manner, the amount of chlorine ion impurity can be reduced to a very low level of, for example, 100 ppm or less. The content of chlorine ion impurity in the carboxyl group-containing resin to be suitably used in the present invention is 0 to 100 ppm, more preferably 0 to 50 ppm, still more preferably 0 to 30 ppm.

Further, by not using an epoxy resin as a starting material, a resin containing no hydroxyl group (or a resin having a reduced amount of hydroxyl group) can be easily obtained. In general, the presence of a hydroxyl group leads to excellent characteristics such as an improved adhesion due to hydrogen bond; however, it is also known that the presence of a hydroxyl group considerably deteriorates the moisture resistance. Therefore, by using a carboxyl group-containing resin which contains no hydroxyl group, the moisture resistance can be improved.

Here, a carboxyl group-containing urethane resin which is synthesized from an isocyanate compound, whose starting material is not phosgene, and a material containing no epihalogydrin and contains chlorine ion impurities in an amount of 0 to 30 ppm can also be suitably employed. By adjusting the equivalents of hydroxyl group and isocyanate group in such a urethane resin, a resin containing no hydroxyl group can be easily synthesized.

Further, as a diol compound, an epoxy acrylate-modified material can also be used when synthesizing the urethane resin. Although chlorine ion impurity is incorporated, it is possible to use an epoxy acrylate-modified material because the amount of chlorine ion impurity can be controlled.

From such a standpoint, for example, in order to obtain a solder resist composition having superior PCT resistance, HAST resistance and thermal shock resistance as a solder resist for semiconductor package, at least one of the above-described carboxyl group-containing resins (4) to (8) can be more suitably employed.

In addition, a carboxyl group-containing photosensitive resin which is obtained by allowing the above-described carboxyl group-containing resin (9) produced by copolymerization with an unsaturated group-containing compound to react with 3,4-epoxycyclohexylmethyl methacrylate, which is a compound containing a cyclic ether group and a (meth)acryloyl group in one molecule, can also be suitably employed since it uses an alicyclic epoxy and thus contains only a small amount of chlorine ion impurities.

Since the above-described (A) carboxyl group-containing resin has a plurality of carboxyl groups in the side chain of the backbone polymer, it can be developed with an aqueous alkaline solution.

It is preferred that the (A) carboxyl group-containing resin used in the present invention have an acid value of 40 to 150 mg KOH/g. When the acid value of the carboxyl group-containing resin is less than 40 mg KOH/g, the development with an alkali may become difficult. On the other hand, when the acid value is higher than 150 mg KOH/g, since the developing solution further dissolves the exposed part, the resulting lines may become excessively thin and in some cases, the exposed and non-exposed parts may be indistinctively dissolved and detached by the developing solution, making it difficult to draw a normal resist pattern. The acid value of the (A) carboxyl group-containing resin is more preferably 50 to 130 mg KOH/g.

The weight-average molecular weight of the (A) carboxyl group-containing resin used in the present invention varies depending on the resin skeleton; however, in general, it is preferably 2,000 to 150,000. When the weight-average molecular weight is less than 2,000, the tack-free performance may be impaired and the moisture resistance of the resulting coating film after exposure to a light may become poor to cause a reduction in the film during development, which may greatly deteriorate the resolution. Meanwhile, when the weight-average molecular weight is higher than 150,000, the developing property may be markedly deteriorated and the storage stability may be impaired. The weight-average molecular weight of the (A) carboxyl group-containing resin is more preferably 5,000 to 100,000.

The amount of the (A) carboxyl group-containing resin to be blended is preferably 20 to 60% by mass based on the total amount of the composition. When the amount is less than 20% by mass, the strength of the resulting coating film may be reduced. Meanwhile, when the amount is higher than 60% by mass, the viscosity of the composition may be increased and the coating properties and the like may be deteriorated. The amount of the (A) carboxyl group-containing resin to be blended is more preferably 30 to 50% by mass.

[(B) Photopolymerization Initiator]

As the (B) photopolymerization initiator used in the present invention, any known photopolymerization initiator can be employed; however, preferred thereamong are oxime ester-based photopolymerization initiators having an oxime ester group, α-aminoacetophenone-based photopolymerization initiators and acylphosphine oxide-based photopolymerization initiators. As the (B) photopolymerization initiator, these photopolymerization initiators may be used individually, or two or more thereof may be used in combination.

Examples of commercially available oxime ester-based photopolymerization initiator include CGI-325, IRGACURE (registered trademark) OXE01 and OXE02, which are manufactured by BASF Japan Ltd.; and N-1919 and ADEKA ARKLS (registered trademark) NCI-831, which are manufactured by ADEKA Corporation.

Further, a photopolymerization initiator having two oxime ester groups in the molecule can also be suitably used, and specific examples thereof include those oxime ester compounds having a carbazole structure that are represented by the following formula:

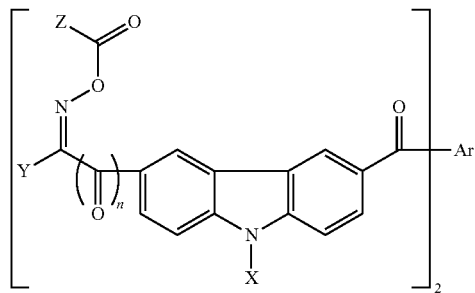

(wherein, X represents a hydrogen atom, an alkyl group having 1 to 17 carbon atoms, an alkoxy group having 1 to 8 carbon atoms, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms); Y and Z each independently represent a hydrogen atom, an alkyl group having 1 to 17 carbon atoms, an alkoxy group having 1 to 8 carbon atoms, a halogen group, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), an anthryl group, a pyridyl group, a benzofuryl group or a benzothienyl group; Ar represents an alkylene having 1 to 10 carbon atoms, vinylene, phenylene, biphenylene, pyridylene, naphthylene, thiophene, anthrylene, thienylene, furylene, 2,5-pyrrole-diyl, 4,4'-stilbene-diyl or 4,2'-styrene-diyl; and n is an integer of 0 or 1).

Particularly, an oxime ester-based photopolymerization initiator wherein, in the above-described formula, X and Y are each a methyl group or an ethyl group; Z is methyl or phenyl; n is 0; and Ar is phenylene, naphthylene, thiophene or thienylene, is preferred.

In cases where an oxime ester-based photopolymerization initiator is used, the amount thereof to be blended is preferably 0.01 to 5 parts by mass with respect to 100 parts by mass of the (A) carboxyl group-containing resin. When the amount is less than 0.01 parts by mass, the photocurability on copper becomes insufficient, which may cause detachment of the resulting coating film and deteriorate the properties of the coating film such as chemical resistance. Meanwhile, when the amount is higher than 5 parts by mass, since light absorption on the surface of the resulting solder resist coating film becomes intense, the depth curability tends to be impaired. The amount of the oxime ester-based photopolymerization initiator to be blended is more preferably 0.5 to 3 parts by mass with respect to 100 parts by mass of the (A) carboxyl group-containing resin.

Specific examples of the α-aminoacetophenone-based photopolymerization initiators include 2-methyl-1-[4-(methylthio)phenyl]-2-morpholinopropanone-1,2-benzyl-2-dimethylamino-1-(4-morpholinophenyl)-butane-1-one, 2-(dimethylamino)-2-[(4-methylphenyl)methyl]-1-[4-(4-morpholinyl)phenyl]-1-butanone and N,N-dimethylaminoacetophenone. Examples of commercially available α-aminoacetophenone-based photopolymerization initiator include IRGACURE 907, IRGACURE 369 and IRGACURE 379, all of which are manufactured by BASF Japan Ltd.

Specific examples of the acylphosphine oxide-based photopolymerization initiators include 2,4,6-trimethylbenzoyl diphenylphosphine oxide, bis(2,4,6-trimethylbenzoyl)-phenylphosphine oxide and bis(2,6-dimethoxybenzoyl)-2,4,4-trimethyl-pentylphosphine oxide. Examples of commercially available acylphosphine oxide-based photopolymerization initiator include LUCIRIN (registered trademark) TPO and IRGACURE 819, which are manufactured by BASF Japan Ltd.

In cases where an α-aminoacetophenone-based photopolymerization initiator or an acylphosphine oxide-based photopolymerization initiator is used, the amount thereof to be blended is preferably 0.01 to 15 parts by mass with respect to 100 parts by mass of the (A) carboxyl group-containing resin. When the amount is less than 0.01 parts by mass, the photocurability on copper becomes insufficient as described in the above, which may cause detachment of the resulting coating film and deteriorate the properties of the coating film such as chemical resistance. Meanwhile, when the amount is higher than 15 parts by mass, sufficient outgas-reducing effect cannot be attained and light absorption on the surface of the resulting solder resist coating film becomes intense, so that the depth curability tends to be impaired. The amount of the α-aminoacetophenone-based photopolymerization initiator or acylphosphine oxide-based photopolymerization initiator to be blended is more preferably 0.5 to 10 parts by mass with respect to 100 parts by mass of the (A) carboxyl group-containing resin.

Further, as the photopolymerization initiator, IRGACURE 389 and IRGACURE 784, which are manufactured by BASF Japan Ltd., can also be suitably employed.

(Photoinitiator Aid or Sensitizer)

In addition to the above-described (B) photopolymerization initiator, in the photocurable resin composition according to the present invention, a photoinitiator aid or a sensitizer may also be suitably used. Examples of the photoinitiator aid or sensitizer include benzoin compounds, acetophenone compounds, anthraquinone compounds, thioxanthone compounds, ketal compounds, benzophenone compounds, tertiary amine compounds and xanthone compounds. These compounds may be used as the (B) photopolymerization initiator depending on the case; however, they are preferably used in combination with the (B) photopolymerization initiator. Further, these photoinitiator aids or sensitizers may be used individually, or two or more thereof may be used in combination.

Examples of the benzoin compounds include benzoin, benzoin methyl ether, benzoin ethyl ether and benzoin isopropyl ether.

Examples of the acetophenone compounds include acetophenone, 2,2-dimethoxy-2-phenyl acetophenone, 2,2-diethoxy-2-phenyl acetophenone and 1,1-dichloroacetophenone.

Examples of the anthraquinone compounds include 2-methylanthraquinone, 2-ethylanthraquinone, 2-t-butylanthraquinone and 1-chloroanthraquinone.

Examples of the thioxanthone compounds include 2,4-dimethylthioxanthone, 2,4-diethylthioxanthone, 2-chlorothioxanthone and 2,4-diisopropylthioxanthone.

Examples of the ketal compounds include acetophenone dimethyl ketal and benzyldimethyl ketal.

Examples of the benzophenone compounds include benzophenone, 4-benzoyldiphenylsulfide, 4-benzoyl-4'-methyldiphenylsulfide, 4-benzoyl-4'-ethyldiphenylsulfide and 4-benzoyl-4'-propyldiphenylsulfide.

Examples of the tertiary amine compounds include ethanolamine compounds and compounds having a dialkylaminobenzene structure, and examples of commercially available products thereof include dialkylaminobenzophenones such as 4,4'-dimethylaminobenzophenone (NISSO CURE (registered trademark) MABP manufactured by Nippon Soda Co., Ltd.) and 4,4'-diethylaminobenzophenone (EAB manufactured by Hodogaya Chemical Co., Ltd.); dialkylamino group-containing coumarin compounds such as 7-(diethylamino)-4-methyl-2H-1-benzopyran-2-one (7-(diethylamino)-4-methylcoumarin); ethyl-4-dimethylaminobenzoate (KAYACURE (registered trademark) EPA manufactured by Nippon Kayaku Co., Ltd.); ethyl-2-dimethylaminobenzoate (QUANTACURE DMB manufactured by International BioSynthetics Inc.); (n-butoxy)ethyl-4-dimethylaminobenzoate (QUANTACURE BEA manufactured by International Bio Synthetics Inc.); isoamylethyl-p-dimethylaminobenzoate (KAYACURE DMBI manufactured by Nippon Kayaku Co., Ltd.); and 2-ethylhexyl-4-dimethylaminobenzoate (ESOLOL 507 manufactured by Van Dyk GmbH). Preferred tertiary amino compounds are those compounds having a dialkylaminobenzene structure and particularly preferred thereamong are dialkylaminobenzophenone compounds; and dialkylamino group-containing coumarin compounds and ketocumarins that have a maximum absorption wavelength in the range of 350 to 450 nm.

As a dialkylaminobenzophenone compound, 4,4'-diethylaminobenzophenone is preferred because of its low toxicity. Since a dialkylamino group-containing coumarin compound has a maximum absorption wavelength in the ultraviolet region of 350 to 410 nm, it causes little coloration, so that not only a colorless and transparent photosensitive composition can be provided, but also a colored solder resist film which reflects the color of a coloring pigment itself can be provided by using a coloring pigment. In particular, 7-(diethylamino)-4-methyl-2H-1-benzopyran-2-one is preferred since it exhibits excellent sensitization effect against a laser light having a wavelength of 400 to 410 nm.

Among the above-described compounds, thioxanthone compounds and tertiary amine compounds are preferred. In particular, by incorporating a thioxanthone compound, the depth curability can be improved.

In cases where a photoinitiator aid or a sensitizer is used, the amount thereof to be blended is preferably 0.1 to 20 parts by mass with respect to 100 parts by mass of the (A) carboxyl group-containing resin. When the amount of the photoinitiator aid or sensitizer is less than 0.1 parts by mass, sufficient sensitization effect is not likely not to be attained. Meanwhile, when the amount is higher than 20 parts by mass, light absorption by the tertiary amine compound on the surface of the coating film becomes intense, so that the depth curability tends to be impaired. The amount of the photoinitiator aid or sensitizer to be blended is more preferably 0.1 to 10 parts by mass with respect to 100 parts by mass of the (A) carboxyl group-containing resin.

It is preferred that the total amount of the photopolymerization initiator, the photoinitiator aid and the sensitizer be not greater than 35 parts by mass with respect to 100 parts by mass of the carboxyl group-containing resin. When the total amount is greater than 35 parts by mass, the depth curability tends to be impaired due to the light absorption caused by these components.

It is noted here that, since these photopolymerization initiator, photoinitiator aid and sensitizer absorb a light of a specific wavelength, they may reduce the sensitivity of the photocurable resin composition and function as an ultraviolet absorber. However, these components are not used solely for the purpose of improving the sensitivity of the composition. These components are, as required, capable of allowing the composition to absorb a light of a specific wavelength, thereby not only improving the photoreactivity of the surface and changing the line shape and opening of the resulting resist into a vertical-form, taper-form or reverse taper-form, but also improving the processing accuracy of the line width and opening size.

[(C) Block Copolymer]

The photocurable resin composition according to the present invention comprises (C) a block copolymer. The term "block copolymer" refers to a copolymer having a molecular structure in which two or more polymers that generally have different properties are connected by covalent bonds in the form of a long chain.

As the block copolymer used in the present invention, a block copolymer of ABA-type or ABA'-type is preferred. Among ABA-type and ABA' type block copolymers, a block copolymer constituted by a middle polymer unit B, which is a soft block having a low grass transition temperature (Tg) of preferably lower than 0° C., and an outer polymer unit A or A', which is a hard block having a high Tg of preferably 0° C. or higher, is preferred. The glass transition temperature, Tg, is measured by differential scanning calorimetry (DSC).

Further, among ABA-type and ABA'-type block copolymers, a block copolymer constituted by a polymer unit A or A' having a Tg of 50° C. or higher and a polymer unit B having a Tg of −20° C. or lower is more preferred.

Still further, among ABA-type and ABA'-type block copolymers, one in which A or A' has a high compatibility with the above-described (A) carboxyl group-containing resin but B has a low compatibility with the above-described (A) carboxyl group-containing resin is preferred. It is believed that a block copolymer whose outer blocks at both ends are compatible with the matrix but middle block is incompatible with the matrix in this manner is likely to exhibit a specific structure in the matrix.

As the component A or A', for example, polymethyl (meth) acrylate (PMMA) and polystyrene (PS) are preferred and, as the component B, for example, poly-n-butylacrylate (PBA) and polybutadiene (PB) are preferred. In addition, by introducing a hydrophilic unit having excellent compatibility with the above-described carboxyl group-containing resin, which is represented by a styrene unit, a hydroxyl group-containing unit, a carboxyl group-containing unit, an epoxy-containing unit, an N-substituted acrylamide unit or the like, to a part of the component A or A', the compatibility of the block copolymer can be further improved. As a result of investigation, the present inventors acquired the following findings. That is, a block copolymer obtained in this manner exhibits particularly good compatibility with the above-described carboxyl group-containing resin. Furthermore, surprisingly, such a block copolymer is capable of improving the thermal shock resistance and even more surprisingly, although the glass transition temperature (Tg) of a resin composition tends to be lowered by an addition of an elastomer, the Tg of a resin composition tends not to be lowered by an addition of the above-described block copolymer; therefore, the above-described block copolymer can be preferably used.

Examples of a method of producing the block copolymer include those method that are described in Japanese Patent Application Nos. 2005-515281 and 2007-516326.

Examples of commercially available block copolymer include acrylic triblock copolymers produced by living polymerization, which are manufactured by Arkema K.K., such as SBM-type block copolymers represented by polystyrene-polybutadiene-polymethyl methacrylate, MAM-type block copolymers represented by polymethyl methacrylate-polybutyl acrylate-polymethyl methacrylate and MAM N-type and MAM A-type block copolymers that are subjected to a modification treatment with a carboxylic acid or a hydrophilic group. Examples of the SBM-type block copolymers include E41, E40, E21 and E20; examples of the MAM-type block copolymers include M51, M52, M53 and M22; examples of the MAM N-type block copolymers include 52N and 22N; and examples of the MAM A-type block copolymers include SM4032XM10.

Further, KURARITY manufactured by Kuraray Co., Ltd. is also a block copolymer derived from methyl methacrylate and butyl acrylate.

Further, as the block copolymer used in the present invention, a ternary or higher order block copolymer is preferred and a block copolymer which is synthesized by a living polymerization method and has a precisely controlled molecular structure is more preferred from the standpoint of attaining the effects of the present invention. This is thought to be because a block copolymer synthesized by a living polymerization method has a narrow molecular weight distribution and, therefore, the characteristics of each unit are clear. The molecular weight distribution of the block copolymer to be used is preferably not greater than 2.5, more preferably not greater than 2.0.

The weight-average molecular weight of the block copolymer is generally in the range of 20,000 to 400,000, more preferably 30,000 to 300,000. When the weight-average molecular weight is less than 20,000, a desired toughness and the effects of having flexibility cannot be attained, so that the tack property becomes poor. Meanwhile, when the weight-average molecular weight is higher than 400,000, the viscosity of the photocurable resin composition is increased, so that the printing and developing properties may be considerably deteriorated.

The amount of the above-described block copolymer to be blended is preferably in the range of 1 to 50 parts by mass, more preferably 5 to 35 parts by mass, with respect to 100 parts by mass of the above-described (A) carboxyl group-containing resin. When the amount is less than 1 part by mass, the effect of the block copolymer is not expected to be exhibited, while when the amount is 50 parts by mass or higher, there is a concern that the developing and coating properties of the photocurable resin composition are deteriorated; therefore, such an amount is not preferred.

[(D) Thermosetting Component]

The photocurable resin composition according to the present invention comprises (D) a thermosetting component which is used for the purpose of improving the properties such as heat resistance and insulation reliability. As the (D) thermosetting component, a known and commonly-used thermosetting resin can be employed and examples thereof include isocyanate compounds, blocked isocyanate compounds, amino resins, maleimide compounds, benzoxazine resins, carbodiimide resins, cyclocarbonate compounds, polyfunctional epoxy compounds, polyfunctional oxetane compounds and episulfide resins. Preferred thereamong are those thermosetting components that have a plurality of cyclic ether groups and/or cyclic thioether groups (hereinafter, simply referred to as "cyclic (thio)ether groups") in one molecule. These thermosetting components having cyclic (thio)ether groups are commercially available in a number of types and are capable of imparting various properties based on their structures.

Such a thermosetting component having a plurality of cyclic (thio)ether groups in one molecule is a compound having a plurality of either or both of 3-, 4- or 5-membered cyclic ether groups and cyclic thioether groups in the molecule, and examples of such compound include compounds having a plurality of epoxy groups in the molecule, namely polyfunctional epoxy compounds; compounds having a plurality of oxetanyl groups in the molecule (i.e. polyfunctional oxetane compounds); and compounds having a plurality of thioether groups in the molecule, (i.e. episulfide resins).

Examples of the above-described polyfunctional epoxy compounds include, but not limited to, bisphenol A-type epoxy resins such as jER828, jER834, jER1001 and jER1004, which are manufactured by Mitsubishi Chemical Corporation, EPICLON 840, EPICLON 850, EPICLON 1050 and EPICLON 2055, which are manufactured by DIC Corporation, EPOTOHTO YD-011, YD-013, YD-127 and YD-128, which are manufactured by NIPPON STEEL & SUMITOMO METAL CORPORATION, D.E.R.317, D.E.R.331, D.E.R.661 and D.E.R.664, which are manufactured by The Dow Chemical Company, SUMI-EPDXY ESA-011, ESA-014, ELA-115 and ELA-128, which are manufactured by Sumitomo Chemical Company, Limited. and A.E.R.330, A.E.R.331, A.E.R.661 and A.E.R.664, which are manufactured by Asahi Kasei Corp. (all of the above are trade names); brominated epoxy resins such as jERYL 903 manufactured by Mitsubishi Chemical Corporation, EPICLON 152 and EPICLON 165, which are manufactured by DIC Corporation, EPOTOHTO YDB-400 and YDB-500, which are manufactured by NIPPON STEEL & SUMITOMO METAL CORPORATION, D.E.R.542 manufactured by The Dow Chemical Company, SUMI-EPDXY ESB-400 and ESB-700, which are manufactured by Sumitomo Chemical Company, Limited. and A.E.R.711 and A.E.R.714, which are manufactured by Asahi Kasei Corp. (all of the above are trade names); novolac-type epoxy resins such as jER152 and jER154, which are manufactured by Mitsubishi Chemical Corporation, D.E.N.431 and D.E.N.438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by NIPPON STEEL & SUMITOMO METAL CORPORATION, EPPN-201, EOCN-1025, EOCN-1020, EOCN-104S, RE-306 and NC-3000H, which are manufactured by Nippon Kayaku Co., Ltd., SUMI-EPDXY ESCN-195X and ESCN-220, which are manufactured by Sumitomo Chemical Company, Limited. and A.E.R.ECN-235 and ECN-299, which are manufactured by Asahi Kasei Corp. (all of the above are trade names); bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004 which are manufactured by NIPPON STEEL & SUMITOMO METAL CORPORATION. (all of the above are trade names); hydrogenated bisphenol A-type epoxy resins such as EPOTOHTO ST-2004, ST-2007 and ST-3000 (trade names) which are manufactured by NIPPON STEEL & SUMITOMO METAL CORPORATION; glycidyl amine-type epoxy resins such as jER604 manufactured by Mitsubishi Chemical Corporation, EPOTOHTO YH-434 manufactured by NIPPON STEEL & SUMITOMO METAL CORPORATION. and SUMI-EPDXY ELM-120 manufactured by Sumitomo Chemical Company, Limited. (all of the above are trade names); alicyclic epoxy resins such as CELLOXIDE 2021 (trade name) manufactured by Daicel Corporation; trihydroxyphenyl methane-type epoxy resins such as YL-933 manufactured by Mitsubishi Chemical Corporation and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by NIPPON STEEL & SUMITOMO METAL CORPORATION; naphthalene group-containing epoxy resins such as ESN-190 and ESN-360, which are manufactured by Nippon Steel Chemical Co., Ltd., and HP-4032, EXA-4750 and EXA-4700, which are manufactured by DIC Corporation; epoxy resins having a dicyclopentadiene skeleton, such as HP-7200 and HP-7200H manufactured by DIC Corporation; flexible and tough epoxy resins of EXA-4816, EXA-4822 and EXA-4850 Series; glycidyl methacrylate copolymer-based epoxy resins such as CP-50S and CP-50M manufactured by NOF Corporation; and cyclohexylmaleimide-glycidyl methacrylate copolymer epoxy resins. These epoxy resins may be used individually, or two or more thereof may be used in combination.

Examples of the above-described polyfunctional oxetane compounds include polyfunctional oxetanes such as bis[(3-methyl-3-oxcetanylmethoxy)methyl]ether, bis[(3-ethyl-3-oxcetanylmethoxy)methyl]ether, 1,4-bis[(3-methyl-3-oxcetanylmethoxy)methyl]benzene, 1,4-bis[(3-ethyl-3-oxcetanylmethoxy)methyl]benzene, (3-methyl-3-oxcetanyl) methyl acrylate, (3-ethyl-3-oxcetanyl)methyl acrylate, (3-methyl-3-oxcetanyl)methyl methacrylate, (3-ethyl-3-oxcetanyl)methyl methacrylate, and oligomers and copolymers thereof; and etherification products of an oxetane alcohol and a resin having a hydroxyl group, such as a novolac resin, a poly(p-hydroxystyrene), a cardo-type bisphenol, a calixarene, a calix resorcin arene or a silsesquioxane. Other examples include copolymers of an unsaturated monomer having an oxetane ring and an alkyl(meth)acrylate.

Examples of the episulfide resins having a plurality of cyclic thioether groups in the molecule include YL7000 (bisphenol A-type episulfide resin) manufactured by Mitsubishi Chemical Corporation. Further, for example, an episulfide resin prepared by the same synthesis method, in which an oxygen atom of an epoxy group of a novolac-type epoxy resin is substituted with a sulfur atom, can also be used.

The amount of the above-described thermosetting component having a plurality of cyclic (thio)ether groups in the molecule to be blended is preferably in the range of 0.3 to 2.5 equivalents, more preferably 0.5 to 2.0 equivalents, with respect to 1 equivalent of carboxyl group in the above-described (A) carboxyl group-containing resin. When the thermosetting component having a plurality of cyclic (thio)ether groups in the molecule is blended in an amount of less than 0.3 equivalent, the carboxyl group may in the resulting cured coating film to cause deterioration in the heat resistance, alkali resistance, electrical insulation and the like, which is not preferred. Meanwhile, when the amount is higher than 2.5 equivalents, cyclic (thio)ether groups having a low molecular weight may remain in the resulting dry coating film to cause deterioration in the strength and the like of the resulting cured coating film, which is also not preferred.

In cases where the above-described thermosetting component having a plurality of cyclic (thio)ether groups in the molecule is used, it is preferred that a thermosetting catalyst be also incorporated. Examples of such thermosetting catalyst include imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine and 4-methyl-N,N-dimethylbenzylamine; hydrazine compounds such as adipic acid dihydrazide and sebacic acid dihydrazide; and phosphorus compounds such as triphenylphosphine. Further, examples of commercially available thermosetting catalyst include 2MZ-A, 2MZ-OK, 2PHZ, 2P4BHZ and 2P4 MHZ (all of which are imidazole-based compounds manufactured by Shikoku Chemicals Corporation; trade names); and U-CAT (registered trademark) 3503N and U-CAT 3502T (both of which are blocked isocyanate compounds of dimethylamine; trade names) and DBU, DBN, U-CAT SA102 and U-CAT 5002 (all of which are either a bicyclic amidine compound or a salt thereof), which are manufactured by San-Apro Ltd. The thermosetting catalyst is not particularly restricted to these compounds and it may be a thermosetting catalyst of an epoxy resin or an oxetane compound, or any compound that facilitates the reaction of an epoxy group and/or an oxetanyl group with a carboxyl group. Such thermosetting catalysts may be used individually, or two or more thereof may be used in combination. Further, an S-triazine derivative, such as guanamine, acetoguanamine, benzoguanamine, melamine, 2,4-diamino-6-methacryloyloxyethyl-S- triazine, 2-vinyl-2,4-diamino-S-triazine, 2-vinyl-4,6-diamino-S-triazine isocyanuric acid adduct or 2,4-diamino-6-methacryloyloxyethyl-S-triazine isocyanuric acid adduct, can also be used. Preferably, such a compound which also functions as an adhesion-imparting agent is used in combination with the above-described thermosetting catalyst.

The amount of the thermosetting catalyst(s) to be incorporated is preferably 0.1 to 20 parts by mass, more preferably 0.5 to 15.0 parts by mass, with respect to 100 parts by mass of the thermosetting component having a plurality of cyclic (thio)ether groups in the molecule.

Examples of the above-described amino resins include amino resins such as melamine derivatives and benzoguanamine derivatives, for example, methylol melamine compounds, methylol benzoguanamine compounds, methylol glycoluril compounds and methylol urea compounds. Moreover, alkoxymethylated melamine compounds, alkoxymethylated benzoguanamine compounds, alkoxymethylated glycoluril compounds and alkoxymethylated urea compounds can be obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and it may be, for example, a methoxymethyl group, an ethoxymethyl group, a propoxymethyl group or a butoxymethyl group. In particular, a melamine derivative having a formalin concentration of not higher than 0.2%, which is not harmful to human body and environment, is preferred.

Examples of commercially available products of the above-described amino resins include CYMEL 300, 301, 303, 370, 325, 327, 701, 266, 267, 238, 1141, 272, 202, 1156, 1158, 1123, 1170, 1174, UFR 65 and 300 (all of which are manufactured by MT Aqua Polymer, Inc.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.).

As the above-described isocyanate compound, a polyisocyanate compound having a plurality of isocyanate groups in the molecule can be used. As such a polyisocyanate compound, for example, an aromatic polyisocyanate, an aliphatic polyisocyanate or an alicyclic polyisocyanate may be employed. Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylene diisocyanate, m-xylene diisocyanate and 2,4-tolylene dimer. Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate. Specific examples of the alicyclic polyisocyanate include bicycloheptane triisocyanate as well as adducts, biurets and isocyanurates of the above-described isocyanate compounds.

The blocked isocyanate groups contained in the above-described blocked isocyanate compound are isocyanate groups that are protected and thus temporarily inactivated by a reaction with a blocking agent. When the blocked isocyanate compound is heated to a prescribed temperature, the blocking agent is dissociated to yield isocyanate groups.

As the blocked isocyanate compound, an addition reaction product between an isocyanate compound and an isocyanate blocking agent may be employed. Examples of an isocyanate compound which can undergo a reaction with a blocking agent include isocyanurate-type, biuret-type and adduct-type isocyanate compounds. As an isocyanate compound to be used for synthesizing the blocked isocyanate compound, for example, an aromatic polyisocyanate, an aliphatic polyisocyanate or an alicyclic polyisocyanate can be employed. Specific examples thereof include those compounds that are exemplified in the above.

Examples of the isocyanate blocking agent include phenolic blocking agents such as phenol, cresol, xylenol, chlorophenol and ethylphenol; lactam-based blocking agents such as ε-caprolactam, δ-valerolactam, γ-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may be of a commercially available product and examples thereof include SUMIDUR BL-3175, BL-4165, BL-1100 and BL-1265, DESMODUR TPLS-2957, TPLS-2062, TPLS-2078 and TPLS-2117 and DESMOTHERM 2170 and 2265 (all of which are manufactured by Sumitomo Bayer Urethane Co., Ltd., trade names); CORONATE 2512, 2513 and 2520 (all of which are manufactured by Nippon Polyurethane Industry Co., Ltd., trade names); B-830, B-815, B-846, B-870, B-874 and B-882 (all of which are manufactured by Mitsui Chemicals, Inc., trade names); and TPA-B80E, 17B-60PX and E402-B80T (all of which are manufactured by Asahi Kasei Chemicals Corporation, trade names). It is noted here that SUMIDUR BL-3175 and BL-4265 are produced by using methylethyl oxime as a blocking agent.

The amount of the above-described polyisocyanate compound or blocked isocyanate compound to be blended is preferably 1 to 100 parts by mass, more preferably 2 to 70 parts by mass, with respect to 100 parts by mass of the above-described (A) carboxyl group-containing resin. When the above-described amount is less than 1 part by mass, a coating film having sufficient toughness may not be obtained, which is not preferred. Meanwhile, when the amount is greater than 100 parts by mass, the storage stability may be deteriorated, which is also not preferred.

In the photocurable resin composition according to the present invention, in order to facilitate the curing reaction between a hydroxyl group or a carboxyl group and an isocyanate group, an urethanation catalyst may be added. As the urethanation catalyst, it is preferred that at least one urethanation catalyst selected from the group consisting of tin-based catalysts, metal chlorides, metal acetylacetates, metal sulfates, amine compounds and amine salts be used.

Examples of the above-described tin-based catalysts include organic and inorganic tin compounds such as stannous octoate and dibutyltin dilaurate.

Examples of the above-described metal chlorides include chlorides of a metal selected from the group consisting of Cr, Mn, Co, Ni, Fe, Cu and Al, such as cobalt (II) chloride, nickelous chloride and ferric chloride.

Examples of the above-described metal acetylacetonates include acetylacetonates of a metal selected from the group consisting of Cr, Mn, Co, Ni, Fe, Cu and Al, such as cobalt acetylacetonate, nickel acetylacetonate and iron acetylacetonate.

Examples of the above-described metal sulfates include sulfates of a metal selected from the group consisting of Cr, Mn, Co, Ni, Fe, Cu and Al, such as copper sulfate.

Examples of the above-described amine compounds include triethylenediamine, N,N,N',N'-tetramethyl-1,6-hexanediamine, bis(2-dimethylaminoethyl)ether, N,N,N',N'', N''-pentamethyl diethylenetriamine, N-methylmorpholine, N-ethylmorpholine, N,N-dimethylethanolamine, dimorpholinodiethyl ether, N-methylimidazole, dimethylaminopyridine, triazine, N'-(2-hydroxyethyl)-N,N,N'-trimethyl-bis (2-aminoethyl)ether, N,N-dimethylhexanolamine, N,N-dimethylaminoethoxy ethanol, N,N,N'-trimethyl-N'-(2-hydroxyethyl)ethylenediamine, N-(2-hydroxyethyl)-N,N', N'',N''-tetramethyl diethylenetriamine, N-(2-hydroxypropyl)-N,N',N'',N'''-tetramethyl diethylenetriamine, N,N,N'-trimethyl-N'-(2-hydroxyethyl)propanediamine, N-methyl-N'-(2-hydroxyethyl)piperazine, bis(N,N-dimethylaminopropyl)amine, bis(N,N-dimethylaminopropyl)isopropanolamine, 2-aminoquinuclidine, 3-aminoquinuclidine, 4-aminoquinuclidine, 2-quinuclidinol, 3-quinuclidinol, 4-quinuclidinol, 1-(2'-hydroxypropyl)imidazole, 1-(2'-hydroxypropyl)-2-methylimidazole, 1-(2'-hydroxyethyl)imidazole, 1-(2'-hydroxyethyl)-2-methylimidazole, 1-(2'-hydroxypropyl)-2-methylimidazole, 1-(3'-aminopropyl)imidazole, 1-(3'-aminopropyl)-2-methylimidazole, 1-(3'-hydroxypropyl)imidazole, 1-(3'-hydroxypropyl)-2-methylimidazole, N,N-dimethylaminopropyl-N'-(2-hydroxyethyl)amine, N,N-dimethylaminopropyl-N',N'-bis(2-hydroxyethyl)amine, N,N-dimethylaminopropyl-N',N'-bis(2-hydroxypropyl) amine, N,N-dimethylaminoethyl-N',N'-bis(2-hydroxyethyl) amine, N,N-dimethylaminoethyl-N',N'-bis(2-hydroxypropyl)amine, melamine and/or benzoguanamine, all of which are conventionally known.

Examples of the above-described amine salts include organic acid-based amine salts of DBU (1,8-diaza-bicyclo [5.4.0]undecene-7).

The amount of the above-described urethanation catalyst to be blended is preferably 0.01 to 20 parts by mass, more preferably 0.5 to 10.0 parts by mass, with respect to 100 parts by mass of the above-described (A) carboxyl group-containing resin.

(Coloring Agent)

In the photocurable resin composition according to the present invention, a coloring agent may also be incorporated. As the coloring agent, a known coloring agent of red, blue, green, yellow or the like can be used, and it may be any of a pigment, a stain and a dye. However, from the standpoint of reducing the environmental stress and the effects on human body, it is preferred that the coloring agent contain no halogen.

Examples of red coloring agent include monoazo-type, disazo-type, azo lake-type, benzimidazolone-type, perylene-type, diketopyrrolopyrrole-type, condensed azo-type, anthraquinone-type and quinacridone-type red coloring agents, and specific examples thereof include those assigned with the following Color Index numbers (C.I.; issued by The Society of Dyers and Colourists).

Monoazo-type: Pigment Reds 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268 and 269

Disazo-type: Pigment Reds 37, 38 and 41

Monoazo lake-type: Pigment Reds 48:1, 48:2, 48:3, 48:4, 49:1, 49:2, 50:1, 52:1, 52:2, 53:1, 53:2, 57:1, 58:4, 63:1, 63:2, 64:1 and 68

Benzimidazolone-type: Pigment Reds 171, 175, 176, 185 and 208

Perylene-type: Solvent Reds 135 and 179, Pigment Reds 123, 149, 166, 178, 179, 190, 194 and 224

Diketopyrrolopyrrole-type: Pigment Reds 254, 255, 264, 270 and 272

Condensed azo-type: Pigment Reds 220, 144, 166, 214, 220, 221 and 242

Anthraquinone-type: Pigment Reds 168, 177 and 216, Solvent Reds 149, 150, 52 and 207

Quinacridone-type: Pigment Reds 122, 202, 206, 207 and 209

Blue Coloring Agent:

Examples of blue coloring agent include phthalocyanine-type and anthraquinone-type blue coloring agents, and examples of pigment-type blue coloring agent include those compounds that are classified into pigment. Specific examples thereof include Pigment Blues 15, 15:1, 15:2, 15:3, 15:4, 15:6, 16 and 60. As a stain-type blue coloring agent, for example, Solvent Blues 35, 63, 68, 70, 83, 87, 94, 97, 122, 136, 67 and 70 can be used. In addition to the above-described ones, a metal-substituted or unsubstituted phthalocyanine compound can be used as well.

Green Coloring Agent:

Similarly, examples of green coloring agent include phthalocyanine-type, anthraquinone-type and perylene-type green coloring agents and specifically, for example, Pigment Greens 7 and 36, Solvent Greens 3, 5, 20 and 28 can be used. In addition to the above-described ones, a metal-substituted or unsubstituted phthalocyanine compound can be used as well.

Yellow Coloring Agent:

Examples of yellow coloring agent include monoazo-type, disazo-type, condensed azo-type, benzimidazolone-type, isoindolinone-type and anthraquinone-type yellow coloring agents and specific examples thereof include the followings.

Anthraquinone-type: Solvent Yellow 163, Pigment Yellows 24, 108, 193, 147, 199 and 202.

Isoindolinone-type: Pigment Yellows 110, 109, 139, 179 and 185.

Condensed azo-type: Pigment Yellows 93, 94, 95, 128, 155, 166 and 180.

Benzimidazolone-type: Pigment Yellows 120, 151, 154, 156, 175 and 181.

Monoazo-type: Pigment Yellows 1, 2, 3, 4, 5, 6, 9, 10, 12, 61, 62, 62:1, 65, 73, 74, 75, 97, 100, 104, 105, 111, 116, 167, 168, 169, 182 and 183.

Disazo-type: Pigment Yellows 12, 13, 14, 16, 17, 55, 63, 81, 83, 87, 126, 127, 152, 170, 172, 174, 176, 188 and 198.

In addition to the above, in order to adjust the color tone, for example, a violet, orange, brown and/or black coloring agent(s) may also be added.

Specific examples of such coloring agent include Pigment Violets 19, 23, 29, 32, 36, 38 and 42; Solvent Violets 13 and 36; C.I. Pigment Oranges 1, 5, 13, 14, 16, 17, 24, 34, 36, 38, 40, 43, 46, 49, 51, 61, 63, 64, 71 and 73; Pigment Browns 23 and 25; and Pigment Blacks 1 and 7.

The blending ratio of the above-described coloring agent is not particularly restricted, and it is sufficient at preferably 10 parts by mass or less, particularly preferably 0.1 to 5 parts by mass, with respect to 100 parts by mass of the above-described carboxyl group-containing photosensitive resin.

(Photopolymerizable Monomer)

In the present invention, a compound having one or more ethylenically unsaturated groups (photopolymerizable monomer) can be used. The photopolymerizable monomer is photo-cured when irradiated with an active energy beam, thereby insolubilizing or assisting to insolubilize the above-described (A) carboxyl group-containing resin to an aqueous alkaline solution.

Examples of a compound used as the photopolymerizable monomer in the present invention include polyester (meth) acrylates, polyether (meth)acrylates, urethane (meth)acrylates, carbonate (meth)acrylates and epoxy (meth)acrylates, all of which are commonly used and known. Specific examples thereof include hydroxyalkyl acrylates such as 2-hydroxyethyl acrylate and 2-hydroxypropyl acrylate; diacrylates of glycol such as ethylene glycol, methoxytetraethylene glycol, polyethylene glycol and propylene glycol; acrylamides such as N,N-dimethylacrylamide, N-methylolacrylamide and N,N-dimethylaminopropylacrylamide; aminoalkyl acrylates such as N,N-dimethylaminoethyl acrylate and N,N-dimethylaminopropyl acrylate; polyvalent (meth)acrylates of polyhydric alcohols (e.g., hexanediol, trimethylolpropane, pentaerythritol, dipentaerythritol and tris-hydroxyethyl isocyanurate) and ethylene oxide adducts, propylene oxide adducts or ε-caprolactone adducts of these polyhydric alcohols; polyvalent acrylates such as phenoxyacrylate, bisphenol A diacrylate and ethylene oxide adducts or propylene oxide adducts of these phenols; and polyvalent acrylates of glycidyl ethers such as glycerin diglycidyl ether, glycerin triglycidyl ether, trimethylolpropane triglycidyl ether and triglycidyl isocyanurate. In addition to the above, examples also include acrylates and melamine acrylates that are obtained by direct acrylation or diisocyanate-mediated urethane acrylation of a polyol such as polyether polyol, polycarbonate diol, hydroxyl group-terminated polybutadiene or polyester polyol; and methacrylates corresponding to the above-described acrylates.

Further, for example, an epoxy acrylate resin obtained by allowing a polyfunctional epoxy resin such as a cresol novolac-type epoxy resin to react with acrylic acid or an epoxy urethane acrylate compound obtained by further allowing the hydroxyl groups of the epoxy acrylate resin to react with a hydroxyacrylate such as pentaerythritol triacrylate and a half urethane compound of diisocyanate such as isophorone diisocyanate may also be used as the photopolymerizable monomer. Such an epoxy acrylate-based resin is capable of improving the photocurability of the photocurable composition without impairing the dryness to touch.

The compound having one or more ethylenically unsaturated groups in the molecule, which is used as the above-described photopolymerizable monomer, is blended in an amount of 5 to 100 parts by mass, more preferably 5 to 70 parts by mass, with respect to 100 parts by mass of the above-described (A) carboxyl group-containing resin. When the above-described amount is less than 5 parts by mass, the photocurability of the photocurable resin composition is impaired, so that it becomes difficult to form a pattern by development with an alkali after irradiation with an active energy beam, which is not preferred. Meanwhile, when the amount is higher than 100 parts by mass, the solubility of the photocurable resin composition to an aqueous alkaline solution may be reduced to make the resulting coating film fragile, which is also not preferred.

(Filler)

In the photocurable resin composition according to the present invention, in order to improve the physical strength and the like of the resulting cured product, a filler may be blended as required. As the filler, any known and commonly used inorganic or organic filler can be used; however, barium sulfate, spherical silica, Neuburg siliceous earth particle or talc is particularly preferably used. Further, in order to impart flame retardancy, for example, aluminum hydroxide, magnesium hydroxide and boehmite can also be used. Moreover, a compound having at least one ethylenically unsaturated group; NANOCRYL (trade name) XP 0396, XP 0596, XP 0733, XP 0746, XP 0765, XP 0768, XP 0953, XP 0954 and XP 1045, in which nano-silica is dispersed in the above-described polyfunctional epoxy resin (manufactured by Hanse-Chemie AG; all of which are product grade names); and NANOPDX (trade name) XP 0516, XP 0525 and XP 0314 (manufactured by Hanse-Chemie AG; all of which are product grade names) can also be used. These fillers may be used individually, or two or more thereof may be blended in combination.

Further, from the standpoint of attaining superior optical transparency, it is preferred that the photocurable resin composition according to the present invention comprise a filler having a refractive index in the range of 1.45 to 1.65. The refractive index of the filler is more preferably in the range of 1.50 to 1.65.

The amount of the above-described filler to be blended is preferably 500 parts by mass or less, more preferably 0.1 to 300 parts by mass, particularly preferably 0.1 to 150 parts by mass, with respect to 100 parts by mass of the above-described (A) carboxyl group-containing resin. When the amount of the filler is higher than 500 parts by mass, the viscosity of the photocurable resin composition may be increased to deteriorate the printing properties and make the resulting cured product fragile; therefore, such an amount of the filler is not preferred.

(Binder Polymer)

In the photocurable resin composition according to the present invention, in order to improve the flexibility and the dryness to touch of the resulting cured product, a known and commonly used binder polymer may be used. As the binder polymer, a cellulose-based, polyester-based or phenoxy resin-based polymer is preferred. Examples of the cellulose-based polymer include cellulose acetate butyrate (CAB) and cellulose acetate propionate (CAP) series that are manufactured by Eastman Chemical Co. As the polyester-based polymer, BILON Series manufactured by Toyobo Co., Ltd. are preferred and, as the phenoxy resin-based polymer, phenoxy resins of bisphenol A, bisphenol F and hydrogenated compounds thereof are preferred.

The amount of the above-described binder polymer to be added is preferably 50 parts by mass or less, more preferably 1 to 30 parts by mass, particularly preferably 5 to 30 parts by mass, with respect to 100 parts by mass of the above-described (A) carboxyl group-containing resin. When the amount of the binder polymer is higher than 50 parts by mass, the alkali developability of the photocurable resin composition may be impaired to shorten the time period in which the photocurable resin composition can be developed; therefore, such an amount of the binder polymer is not preferred.

(Elastomer)

In the photocurable resin composition according to the present invention, for example, in order to impart the resulting cured product with flexibility and improve the fragility of the cured product, an elastomer can be blended. Examples of the elastomer include polyester-based elastomers, polyurethane-based elastomers, polyester urethane-based elastomers, polyamide-based elastomers, polyester amide-based elastomers, acrylic elastomers and olefin-based elastomers. In addition, for example, a resin obtained by modifying some or all of epoxy groups contained in an epoxy resin having various skeletons with a butadiene-acrylonitrile rubber whose terminals are both modified with a carboxylic acid can also be used. Moreover, for example, an epoxy-containing polybutadiene-based elastomer, an acryl-containing polybutadiene-based elastomer, a hydroxyl group-containing polybutadiene-based elastomer and a hydroxyl group-containing isoprene-based elastomer can be used as well. These elastomers may be used individually, or two or more thereof may be used in the form of a mixture.

In the photocurable resin composition according to the present invention, as required, a thixo agent such as fine powder silica, organic bentonite, montmorillonite or hydrotalcite may also be incorporated. As the thixo agent, organic bentonite and hydrotalcite are preferred because of their excellent stability with time, and hydrotalcite is particularly preferred since it has excellent electrical characteristics. In addition, an additive(s) that are known and commonly used, such as a thermal polymerization inhibitor, a silicone-based, fluorine-based or polymer-based antifoaming agent, a leveling agent, an imidazole-based, thiazole-based or triazole-based silane coupling agent, a corrosion inhibitor and/or a bisphenol-based or triazinethiol-based copper inhibitor, may also be blended.

(Other Additives)

The photocurable resin composition according to the present invention may further comprise, as required, other additive(s) that are known and commonly used, such as a chain transfer agent, a corrosion inhibitor, an adhesion-improving agent, an antioxidant, a polymerization inhibitor and/or an ultraviolet absorber.

(Organic Solvent)

Further, the photocurable resin composition according to the present invention may also comprise an organic solvent for the purpose of synthesizing the above-described (A) carboxyl group-containing resin, preparing the composition or adjusting the viscosity of the composition for coating onto a substrate or a carrier film.

Examples of such an organic solvent include ketones, aromatic hydrocarbons, glycol ethers, glycol ether acetates, esters, alcohols, aliphatic hydrocarbons and petroleum-based solvents. More specific examples thereof include ketones such as methyl ethyl ketone and cyclohexanone; aromatic hydrocarbons such as toluene, xylene and tetramethylbenzene; glycol ethers such as cellosolve, methylcellosolve, butylcellosolve, carbitol, methylcarbitol, butylcarbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methyl ether acetate, propylene glycol ethyl ether acetate, propylene glycol butyl ether acetate; alcohols such as ethanol, propanol, ethylene glycol and propylene glycol; aliphatic hydrocarbons such as octane and decane; and petroleum-based solvents such as petroleum ether, petroleum naphtha, hydrogenated petroleum naphtha and solvent naphtha. These organic solvents may be used individually, or two or more thereof may be used in the form of a mixture.

The photocurable resin composition according to the present invention can also be made into the form of a dry film which comprises a carrier film (support) and a layer formed thereon from the above-described photocurable resin composition.

When forming a dry film, the photocurable resin composition according to the present invention is diluted with the above-described organic solvent to adjust the viscosity to an appropriate level and the resulting photocurable resin composition is coated onto a carrier film in a uniform thickness using a comma coater, a blade coater, a lip coater, a rod coater, a squeeze coater, a reverse coater, a transfer roll coater, a gravure coater, a spray coater or the like. Usually, by drying the thus coated photocurable resin composition at a temperature of 50 to 130° C. for 1 to 30 minutes, a film can be prepared. The thickness of the coating film is not particularly restricted; however, it is appropriately selected to be in the range of 5 to 150 μm, preferably 10 to 60 μm, in terms of the film thickness after drying.

As the carrier film, a plastic film is employed, and it is preferred to use a plastic film such as a polyester film (e.g., polyethylene terephthalate), a polyimide film, a polyamide-imide film, a polypropylene film or a polystyrene film. The thickness of the carrier film is not particularly restricted; however, generally, it is appropriately selected to be in the range of 10 to 150 μm.

After forming a film of the photocurable resin composition according to the present invention on the carrier film, in order to prevent dust from adhering to the surface of the thus formed film, it is preferred that a detachable cover film be further laminated on the film surface.

As the detachable cover film, for example, a polyethylene film, a polytetrafluoroethylene film, a polypropylene film or a surface-treated paper can be used, and the cover film may be any film as long as the adhesive force between the formed film and the cover film is smaller than the adhesive force between the formed film and the carrier film at the time of detaching the cover film.

The photocurable resin composition according to the present invention is, for example, after being adjusted with the above-described organic solvent to have a viscosity suitable for a coating method, applied onto a substrate by a dip coating method, a flow coating method, a roll coating method, a bar coater method, a screen printing method, a curtain coating method or the like and then heated at a temperature of about 60 to 100° C. to dry the organic solvent contained in the composition by evaporation (predrying), thereby a tack-free coating film can be formed. Further, in cases where the above-described composition is coated and dried on a carrier film and the resulting film is then rolled up to obtain a dry film, a resin insulation layer can be formed by pasting the dry film onto a substrate using a laminator or the like such that the photocurable resin composition layer and the substrate are in contact with each other and subsequently removing the carrier film.

Examples of the above-described substrate include, in addition to printed wiring boards and flexible printed wiring boards that are formed with a circuit in advance, copper-clad laminates of all grades (e.g. FR-4), for example, copper-clad laminates for high-frequency circuit that are composed of a material such as paper phenol, paper epoxy, glass fabric epoxy, glass polyimide, glass fabric/nonwoven epoxy, glass fabric/paper epoxy, synthetic fiber epoxy, fluorine-polyethylene-PPO-cyanate ester; other polyimide films; PET films; glass substrates; ceramic substrates; and wafer plates.

The drying by evaporation, which is performed after applying the photocurable resin composition of the present invention, can be carried out using a hot air circulation-type drying oven, an IR oven, a hot plate, a convection oven or the like (a method in which a dryer equipped with a heat source of a steam air-heating system is employed to bring a hot air inside the dryer into contact against the composition or a method in which a hot air is blown against the support via a nozzle).

After applying the photocurable resin composition according to the present invention and drying the solvent by evaporation, by exposing the resulting coating film to a light (irradiation with an active energy beam), the exposed part (the part irradiated with the active energy beam) is cured. Further, a resist pattern is formed by selectively exposing the resulting film to an active energy beam through a patterned photomask by a contact (or non-contact) method or directly exposing the resulting film to a pattern using a laser direct exposure apparatus and then developing the resulting non-exposed part with a dilute aqueous alkaline solution (for example, 0.3 to 3 wt % aqueous sodium carbonate solution).

The exposure apparatus used for the above-described irradiation with an active energy beam may be any apparatus as long as it is equipped with a high-pressure mercury lamp, an ultra-high-pressure mercury lamp, a metal halide lamp, a mercury short arc lamp or the like by which an ultraviolet ray is irradiated in the range of 350 to 450 nm. Further, a direct imaging apparatus (for example, a laser direct imaging apparatus which utilizes a laser to directly draw an image based on CAD data transmitted from a computer) can be used as well. The laser source of the direct imaging apparatus may either be a gas laser or a solid-state laser as long as the laser light has a maximum wavelength in the range of 350 to 410 nm. The exposure dose for image formation varies depending on the film thickness and the like; however, generally, it may be in the range of 20 to 800 mJ/$cm^2$, preferably 20 to 600 mJ/$cm^2$.

The above-described development can be performed by, for example, a dipping method, a shower method, a spray method or a brush method. As a developing solution, an aqueous alkaline solution of potassium hydroxide, sodium hydroxide, sodium carbonate, potassium carbonate, sodium phosphate, sodium silicate, ammonia, amine or the like can be employed.

EXAMPLES

The present invention will now be described concretely by way of examples and the like; however, the present invention is not restricted to the following examples by any means. It is noted here that, in the following examples and the like, "part(s)" and "%" are all based on the mass unless otherwise specified.

Synthesis of Carboxyl Group-Containing Resin

Synthesis Example 1

To an autoclave equipped with a thermometer, a nitrogen and alkylene oxide introduction device and a stirring device, 119.4 g of a novolac-type cresol resin (manufactured by Showa Denko K.K.; SHONOL (registered trademark) CRG951, OH equivalent: 119.4), 1.19 g of potassium hydroxide and 119.4 g of toluene were loaded. The atmosphere inside the system was replaced with nitrogen under stirring and then heated.

Subsequently, 63.8 g of propylene oxide was slowly added dropwise and the resultant was allowed to react for 16 hours at a temperature of 125 to 132° C. and a pressure of 0 to 4.8 kg/$cm^2$. Thereafter, the system was cooled to room temperature and 1.56 g of 89% phosphoric acid was added and mixed with the resulting reaction solution to neutralize potassium hydroxide, thereby obtaining a propylene oxide reaction solution of the novolac-type cresol resin, which had a non-volatile content of 62.1% and a hydroxyl value of 182.2 g/eq. In this reaction solution, an average of 1.08 mol of alkylene oxide was added per 1 equivalent of phenolic hydroxyl group.

Further, 293.0 g of the thus obtained alkylene oxide reaction solution of the novolac-type cresol resin, 43.2 g of acrylic acid, 11.53 g of methanesulfonic acid, 0.18 g of methylhydroquinone and 252.9 g of toluene were loaded to a reaction vessel equipped with a stirrer, a thermometer and an air blowing tube. While blowing air into the resulting mixture at a rate of 10 ml/min, the mixture was allowed to react for 12 hours at 110° C. with stirring. By this reaction, 12.6 g of water was distilled out as an azeotropic mixture with toluene.

Thereafter, the system was cooled to room temperature and the thus obtained reaction solution was neutralized with 35.35 g of 15% aqueous sodium hydroxide solution and then washed with water. Subsequently, toluene was replaced with 118.1 g of diethylene glycol monoethyl ether acetate and distilled off using an evaporator to obtain a novolac-type acrylate resin solution. Further, 332.5 g of the thus obtained novolac-type acrylate resin solution and 1.22 g of triphenylphosphine were loaded to a reaction vessel equipped with a stirrer, a thermometer and an air blowing tube. While blowing air into the resulting mixture at a rate of 10 ml/min, 60.8 g of tetrahydrophthalic anhydride was slowly added with stirring, and the resultant was allowed to react for 6 hours at a temperature of 95 to 101° C.

In this manner, a carboxyl group-containing photosensitive resin solution having a solid acid value of 88 mg KOH/g and a non-volatile content of 71% was obtained. This solution is hereinafter referred to as "varnish A-1".

Synthesis Example 2

To 600 g of diethylene glycol monoethyl ether acetate, 1,070 g of o-cresol novolac-type epoxy resin (EPICLON (registered trademark) N-695 manufactured by DIC Corporation; softening point: 95° C., epoxy equivalent: 214, average number of functional groups: 7.6) (number of glycidyl groups (total number of aromatic rings): 5.0 mol), 360 g (5.0 mol) of acrylic acid and 1.5 g of hydroquinone were loaded, and the resulting mixture was uniformly dissolved by heating it to 100° C. with stirring.

Then, 4.3 g of triphenylphosphine was loaded and, after allowing the resultant to react for 2 hours by heating it to 110° C., the resultant was further allowed to react for 12 hours at 120° C. To the thus obtained reaction solution, 415 g of aromatic hydrocarbon (SOLVESSO 150) and 456.0 g (3.0 mol) of tetrahydrophthalic anhydride were loaded, and the resultant was allowed to react for 4 hours at 110° C. and then cooled.

In this manner, a resin solution having a solid acid value of 89 mg KOH/g and a solid content of 65% was obtained. This solution is hereinafter referred to as "varnish A-2".

(Preparation of Block Copolymer Varnishes)

To 15 g of MAM-type block copolymer M52, 50 g of carbitol acetate was added. The block copolymer was dissolved by stirring and heating the resulting mixture at 85° C. (solid content: 23.1%). The thus obtained solution is hereinafter referred to as "varnish BC-1".

To 15 g of hydrophilized MAM N-type block copolymer M52N, 50 g of carbitol acetate was added. The block copolymer was dissolved by stirring and heating the resulting mixture at 85° C. (solid content: 23.1%). The thus obtained solution is hereinafter referred to as "varnish BC-2".

To 15 g of MAM-type block copolymer M53, 50 g of carbitol acetate was added. The block copolymer was dissolved by stirring and heating the resulting mixture at 85° C.

(solid content: 23.1%). The thus obtained solution is hereinafter referred to as "varnish BC-3".

To 15 g of hydrophilized MAM N-type block copolymer M22N, 50 g of carbitol acetate was added. The block copolymer was dissolved by stirring and heating the resulting mixture at 85° C. (solid content: 23.1%). The thus obtained solution is hereinafter referred to as "varnish BC-4".

To 15 g of MAM-type block copolymer M51, 50 g of carbitol acetate was added. The block copolymer was dissolved by stirring and heating the resulting mixture at 85° C. (solid content: 23.1%). The thus obtained solution is hereinafter referred to as "varnish BC-5".

To 15 g of MAM-type block copolymer M22, 50 g of carbitol acetate was added. The block copolymer was dissolved by stirring and heating the resulting mixture at 85° C.

AS-3000E manufactured by Negami Chemical Industrial Co., Ltd. (principal component: polybutyl acrylate, Mw: 650,000, solid content: 30%) was used and the thus obtained solution is hereinafter referred to as "varnish C-2".

Examples 1 to 9 and Comparative Examples 1 to 3

The above-described resin solutions (varnishes) of Synthesis Examples were each blended with the various components shown in Table 1 below at the ratios (parts by mass) shown in Table 1. The resultants were each pre-mixed using a stirrer and then kneaded with a 3-roll mill to prepare the respective photocurable resin compositions. Here, by particle size measurement using a grindmeter manufactured by Erichsen, the thus obtained photosensitive resin compositions were evaluated to have a dispersion degree of 15 µm or less.

TABLE 1

| Composition (parts by mass) | | Example | | | | | | | | | Comparative Example | | |
|---|---|---|---|---|---|---|---|---|---|---|---|---|---|
| | | 1 | 2 | 3 | 4 | 5 | 6 | 7 | 8 | 9 | 1 | 2 | 3 |
| Varnish | A-1 | 141 | 141 | 141 | 141 | 141 | 141 | 141 | 141 | 85 | 141 | 85 | 141 |
| | A-2 | — | — | — | — | — | — | — | — | 62 | — | 62 | — |
| Block copolymer | BC-1 | 55 | — | — | — | — | — | — | 25 | — | — | — | — |
| | BC-2 | — | 55 | — | — | — | — | 55 | 30 | 55 | — | — | — |
| | BC-3 | — | — | 55 | — | — | — | — | — | — | — | — | — |
| | BC-4 | — | — | — | 55 | — | — | — | — | — | — | — | — |
| | BC-5 | — | — | — | — | 55 | — | — | — | — | — | — | — |
| | BC-6 | — | — | — | — | — | 55 | — | — | — | — | — | — |
| Comparative copolymer | C-1 | — | — | — | — | — | — | — | — | — | — | — | 33 |
| | C-2 | — | — | — | — | — | — | — | — | — | — | — | 17 |
| Photopolymerization initiator | (B-1)*1 | 7.5 | — | — | — | — | — | — | — | — | — | — | — |
| | (B-2)*2 | — | 10 | 10 | 10 | 10 | 10 | 10 | 10 | 10 | 10 | 10 | 10 |
| | (B-3)*3 | 1.5 | 1.5 | 1.5 | 1.5 | 1.5 | 1.5 | 1.5 | 1.5 | 1.5 | 1.5 | 1.5 | 1.5 |
| Thermosetting component | (D-1)*4 | 30 | 30 | 30 | 30 | 30 | 30 | 30 | 30 | 30 | 30 | 30 | 30 |
| | (D-2)*5 | 20 | 20 | 20 | 20 | 20 | 20 | 20 | 20 | 20 | 20 | 20 | 20 |
| Filler | *6 | 70 | 70 | 70 | 70 | 70 | 70 | 30 | 30 | 70 | 70 | 70 | 70 |
| | *7 | — | — | — | — | — | — | 10 | 10 | 10 | — | 10 | — |
| | *8 | — | — | — | — | — | — | 30 | 30 | 10 | — | 10 | — |
| Coloring agent*9 | | 0.3 | 0.3 | 0.3 | 0.3 | 0.3 | 0.3 | 0.3 | 0.3 | 0.3 | 0.3 | 0.3 | 0.3 |
| Coloring agent*10 | | 0.8 | 0.8 | 0.8 | 0.8 | 0.8 | 0.8 | 0.8 | 0.8 | 0.8 | 0.8 | 0.8 | 0.8 |
| Chain transfer agent*11 | | 0.2 | 0.2 | 0.2 | 0.2 | 0.2 | 0.2 | 0.2 | 0.2 | 0.2 | 0.2 | 0.2 | 0.2 |
| Melamine | | 3.0 | 3.0 | 3.0 | 3.0 | 3.0 | 3.0 | 3.0 | 3.0 | 3.0 | 3.0 | 3.0 | 3.0 |
| Antioxidant | *12 | 0.7 | 0.7 | 0.7 | 0.7 | 0.7 | 0.7 | 0.7 | 0.7 | 0.7 | 0.7 | 0.7 | 0.7 |
| | *13 | 0.7 | 0.7 | 0.7 | 0.7 | 0.7 | 0.7 | 0.7 | 0.7 | 0.7 | 0.7 | 0.7 | 0.7 |
| Silicone-based antifoaming agent | | 3 | 3 | 3 | 3 | 3 | 3 | 3 | 3 | 3 | 3 | 3 | 3 |
| Organic solvent*14 | | 5 | 5 | 5 | 5 | 5 | 5 | 5 | 5 | 5 | 5 | 5 | 5 |
| DPHA*15 | | 15 | 15 | 15 | 15 | 15 | 15 | 15 | 15 | 15 | 15 | 15 | 15 |

*1 2-methyl-1-(4-methylthiophenyl)-2-morpholinopropane-1-one (IRGACURE 907: manufactured by BASF Japan Ltd.)
*2 2,4,6-trimethylbenzoyl-diphenyl-phosphine oxide (LUCIRIN TPO: manufactured by BASF Japan Ltd.)
*3 ethanone, 1-[9-ethyl-6-(2-methylbenzoyl)-9H-carbazole-3-yl]-1,1-(o-acetyloxime) (IRGACURE OXE 02: manufactured by BASF Japan Ltd.)
*4 biphenyl novolac-type epoxy resin (NC-3000 HCA75: manufactured by Nippon Kayaku Co., Ltd.)
*5 bisphenol-type epoxy resin (YSLV-80XY: manufactured by NIPPON STEEL & SUMITOMO METAL CORPORATION.)
*6: barium sulfate (manufactured by Sakai Chemical Industry Co., Ltd.)
*7: ADMAFINE SO-E2 (manufactured by Admatechs Company Limited.)
*8: AKTISIL AM (manufactured by Hoffmann Mineral GmbH)
*9 C.I. Pigment Blue 15:3
*10 C.I. Pigment Yellow 147
*11 2-mercaptobenzothiazole
*12: IRGAFOS 168: manufactured by BASF Japan Ltd.
*13: IRGANOX 1010: manufactured by BASF Japan Ltd.
*14 diethylene glycol monoethyl ether acetate
*15 dipentaerythritol pentaacrylate (solid content: 23.1%). The thus obtained solution is hereinafter referred to as "varnish BC-6".

(Preparation of Comparative Copolymer Varnishes)

To 15 g of BR-87 manufactured by Mitsubishi Rayon Co., Ltd. (principal component: polymethyl methacrylate, Mw: 25,000), 50 g of carbitol acetate was added. BR-87 was dissolved by stirring and heating the resulting mixture at 100° C. (solid content: 23.1%). The thus obtained solution is hereinafter referred to as "varnish C-1".

For the respective compositions of Examples and Comparative Examples that are shown in Table 1, their performances and properties were evaluated by the following methods. The evaluation results are shown in Table 2.
Performance Evaluations:
<Optimum Exposure Dose>
After subjecting an 18 µm-thick circuit pattern substrate to a copper surface roughening treatment (MEC ETCH BOND CZ-8100, manufactured by MEC COMPANY LTD.), the resulting substrate was washed with water and dried. Then, the photocurable resin compositions of Examples and Comparative Examples that are shown in Table 1 were each coated onto the entire surface of the substrate by a screen printing method and dried in an 80° C. hot air circulation-type drying oven for 30 minutes, thereby forming a dry coating film of about 20 μm in thickness. Thereafter, the thus formed dry coating film was exposed through a step tablet (Kodak No. 2) using an exposure apparatus equipped with a high-pressure mercury lamp and then developed for 90 seconds (30° C., 0.2 MPa, 1% aqueous sodium carbonate solution). In this process, the exposure dose at which the pattern of the step tablet remained in seven tiers was defined as the optimum exposure does.

<Maximum Developable Life>

The compositions of Examples and Comparative Examples that are shown in Table 1 were each coated onto the entire surface of a patterned copper foil substrate by screen printing such that the dry film thickness became about 20 μm. The resulting substrates were each dried at 80° C. and taken out at 10-minute intervals during the drying period between 20 minutes and 80 minutes, followed by cooling to room temperature. Then, the substrates were each developed for 90 seconds with 30° C. 1% aqueous sodium carbonate solution at a spray pressure of 0.2 MPa and the maximum allowable drying time where no dry coating film remained was determined as the maximum developable life.

Property Evaluations:

The compositions of Examples and Comparative Examples that are shown in Table 1 were each coated onto the entire surface of a patterned copper foil substrate by screen printing such that the dry film thickness became about 20 μm. The resulting substrates were dried at 80° C. for 30 minutes and then allowed to cool to room temperature. Subsequently, the substrates were each exposed to a solder resist pattern at an optimum exposure dose using an exposure apparatus equipped with a high-pressure mercury short arc lamp and then developed for 90 seconds with 30° C. 1% aqueous sodium carbonate solution at a spray pressure of 0.2 MPa, thereby forming a resist pattern. The resulting substrates were each irradiated with ultraviolet light at a cumulative exposure dose of 1,000 mJ/cm$^2$ in a UV conveyor furnace and then heat-cured at 150° C. for 60 minutes. The properties of the thus obtained printed substrates (evaluation substrates) were evaluated as described below.

<Acid Resistance>

The evaluation substrates were each immersed in 10% by volume aqueous $H_2SO_4$ solution at room temperature for 30 minutes. Infiltration of the solution and elution of the substrates were visually verified and detachment of the coating film was evaluated by a tape peeling test.

○: No change was observed.
Δ: A slight change was observed.
x: The coating film was blistered or swollen and detached.

<Alkali Resistance>

The evaluation substrates were each immersed in 10% by volume aqueous NaOH solution at room temperature for 30 minutes. Infiltration of the solution and elution of the substrates were visually verified and detachment of the coating film was evaluated by a tape peeling test.

○: No change was observed.
Δ: A slight change was observed.
x: The coating film was blistered or swollen and detached.

<Solder Heat Resistance>

After coating a rosin-based flux onto the respective evaluation substrates, the resulting evaluation substrates were each immersed in a solder bath whose temperature had been preset at 260° C. and the flux was washed with denatured alcohol. Then, swelling and detachment of the resist layer were visually evaluated. The evaluation criteria were as follows.

○: No detachment was observed even when 10-second immersion was repeated three or more times.
Δ: The resist layer was slightly detached when 10-second immersion was repeated three times.
x: The resist layer was swollen and detached after repeating 10-second immersion not more than twice.

<Resistance to Electroless Gold Plating>

The evaluation substrates were each subjected to electroless plating treatments in a commercially available electroless nickel plating bath and electroless gold plating bath to a nickel thickness of 5 μm and a gold thickness of 0.05 μm. After evaluating the presence or absence of detachment of the resist layer and infiltration of the plating solution on the thus plated evaluation substrates, the presence or absence of detachment of the resist layer was also evaluated by a tape peeling test. The evaluation criteria were as follows.

○: Neither infiltration nor whitening was observed after the plating and the resist layer was not detached after the tape peeling.
Δ: Infiltration and whitening were observed after the plating; however, no detachment of the resist layer was observed after the tape peeling.
x: Infiltration and whitening were observed after the plating and the resist layer was detached after the tape peeling.

<PCT Resistance>

The evaluation substrates were each subjected to electroless gold plating in the same manner as in the above evaluation of the resistance to electroless gold plating and then treated for various time periods using a PCT apparatus (HAST SYSTEM TPC-412MD, manufactured by ESPEC Corp.) at a temperature of 121° C. and a pressure of 0.2 MPa under a saturated condition so as to evaluate the PCT resistance based on the condition of the coating film. The evaluation criteria were as follows.

○: No swelling, detachment, discoloration or elution was observed even after a test period of 240 hours.
Δ: No swelling, detachment, discoloration or elution was observed after a test period of 168 hours; however, at least one of swelling, detachment, discoloration and elution was observed after a test period of 240 hours.
x: Swelling, detachment, discoloration and/or elution was/were observed after a test period of 168 hours.

<Thermal Shock Resistance>

An evaluation substrate having a solder resist cured film on which a square-cut pattern and circle-cut pattern were formed was prepared. Using a thermal shock tester (manufactured by ETAC Engineering Co, Ltd.), the thus obtained evaluation substrate was subjected to a 1,000-cycle resistance test in which each cycle consisted of a 30-minute treatment at −55° C. and a 30-minute treatment at 150° C. After the test, the thus treated cured film was visually observed to evaluate the condition of crack generation based on the following criteria.

⊚: The crack occurrence was less than 10%.
○: The crack occurrence was 10% to less than 30%.
Δ: The crack occurrence was 30 to 50%
x: The crack occurrence was higher than 50%.

<HAST Property>

On a BT substrate having a comb-shaped electrode (line/space=30 μm/30 μm) formed thereon, a solder resist cured coating film was formed to prepare an evaluation substrate. The thus obtained substrate was placed in an incubator having an atmosphere with a temperature of 130° C. and a humidity of 85%, and a voltage of 5.5 V was charged thereto to perform a HAST test in the incubator. After various time periods, the insulation resistance inside the incubator was evaluated based on the following criteria.

○: After a test period of 240 hours, no short-circuit was confirmed and the resistance was $10^8 \Omega$ or higher.
Δ: After a test period of 240 hours, no short-circuit was confirmed and the resistance was lower than $10^8 \Omega$
x: Short-circuit occurred.

TABLE 2

| Property | Example | | | | | | | | | Comparative Example | | |
|---|---|---|---|---|---|---|---|---|---|---|---|---|
| | 1 | 2 | 3 | 4 | 5 | 6 | 7 | 8 | 9 | 1 | 2 | 3 |
| Optimum exposure dose (mJ/cm$^2$) | 200 | 200 | 200 | 200 | 200 | 200 | 200 | 200 | 200 | 200 | 200 | 150 |
| Maximum developable life (min) | 70 | 60 | 60 | 60 | 60 | 60 | 60 | 60 | 60 | 60 | 60 | 40 |
| Acid resistance | ○ | ○ | ○ | ○ | ○ | ○ | ○ | ○ | ○ | ○ | ○ | ○ |
| Alkali resistance | ○ | ○ | ○ | ○ | ○ | ○ | ○ | ○ | ○ | ○ | ○ | ○ |
| Solder heat resistance | ○ | ○ | ○ | ○ | ○ | ○ | ○ | ○ | ○ | ○ | ○ | ○ |
| Resistance to electroless gold plating | ○ | ○ | ○ | ○ | ○ | ○ | ○ | ○ | ○ | ○ | ○ | ○ |
| PCT resistance | ○ | ○ | ○ | ○ | ○ | ○ | ○ | ○ | Δ | ○ | Δ | ○ |
| Thermal shock resistance | ○ | ◎ | ○ | ◎ | ○ | ○ | ◎ | ◎ | ◎ | X | X | X |
| HAST property | ○ | ○ | ○ | ○ | ○ | ○ | ○ | ○ | Δ | ○ | Δ | Δ |

Examples 10 to 18 and Comparative Examples 4 to 6

The compositions of Examples 1 to 9 and Comparative Examples 1 to 3, which were prepared in accordance with the respective blending ratios shown in Table 1, were each diluted with methyl ethyl ketone, coated onto a PET film and then dried at 80° C. for 30 minutes, thereby forming a 20 μm-thick photocurable resin composition layer. Then, a cover film was further laminated on each of the thus formed layers to prepare dry films of Example 10 to 18 and Comparative Examples 4 to 6. It is noted here that the compositions of Examples 1 to 9 and Comparative Examples 1 to 3 correspond to the dry films of Examples 10 to 18 and Comparative Examples 4 to 6, respectively, in such a manner that the dry film of Example 10 is prepared by using the resin composition of Example 1, the dry film of Example 11 is prepared by using the resin composition of Example 2 and so on.

<Evaluation of Dry Films>

The cover film was removed from each of the thus obtained dry films and the resulting films were each heat-laminated onto a patterned copper foil substrate. Then, the resulting substrates were exposed under the same conditions as in the case of the substrates that were used in the above-described Examples for evaluation of the coating film properties. After the exposure, the carrier film was detached and the substrates were each developed for 90 seconds with 30° C. 1 wt % aqueous sodium carbonate solution at a spray pressure of 0.2 MPa, thereby forming a resist pattern. The resulting substrates were each irradiated with ultraviolet light at a cumulative exposure dose of 1,000 mJ/cm$^2$ in a UV conveyor furnace and then heat-cured at 150° C. for 60 minutes. For the thus obtained test substrates having a cured coating film, the properties were evaluated by performing tests in accordance with the above-described test methods and evaluation methods. The results are shown in Table 3.

TABLE 3

| Property | Example | | | | | | | | | Comparative Example | | |
|---|---|---|---|---|---|---|---|---|---|---|---|---|
| | 10 | 11 | 12 | 13 | 14 | 15 | 16 | 17 | 18 | 4 | 5 | 6 |
| Optimum exposure dose (mJ/cm$^2$) | 200 | 200 | 200 | 200 | 200 | 200 | 200 | 200 | 200 | 200 | 200 | 150 |
| Acid resistance | ○ | ○ | ○ | ○ | ○ | ○ | ○ | ○ | ○ | ○ | ○ | ○ |
| Alkali resistance | ○ | ○ | ○ | ○ | ○ | ○ | ○ | ○ | ○ | ○ | ○ | ○ |
| Solder heat resistance | ○ | ○ | ○ | ○ | ○ | ○ | ○ | ○ | ○ | ○ | ○ | ○ |
| Resistance to electroless gold plating | ○ | ○ | ○ | ○ | ○ | ○ | ○ | ○ | ○ | ○ | ○ | ○ |
| PCT resistance | ○ | ○ | ○ | ○ | ○ | ○ | ○ | ○ | Δ | ○ | Δ | ○ |
| Thermal shock resistance | ○ | ◎ | ○ | ◎ | ○ | ○ | ◎ | ◎ | ◎ | X | X | X |
| HAST property | ○ | ○ | ○ | ○ | ○ | ○ | ○ | ○ | Δ | ○ | Δ | Δ |

As clearly seen from the above-described results of the respective Examples, the cured products that were obtained from the photocurable resin composition according to the present invention which comprises a block copolymer exhibited excellent acid resistance, alkali resistance, solder heat resistance, resistance to electroless plating, PCT resistance, thermal shock resistance and HAST property. On the other hand, those cured products that were obtained from the photocurable resin compositions of the above-described Comparative Examples were poor particularly in the thermal shock resistance.

The invention claimed is:

1. An alkali-developable photocurable/thermosetting resin composition, comprising:
 a carboxyl group-containing photosensitive resin;
 a photopolymerization initiator;
 a block copolymer; and
 a thermosetting component,
 wherein the carboxyl group-containing photosensitive resin is obtained from a starting material without an epoxy resin, and
 the block copolymer is represented by Formula (I):

A-B-A (I), where each A individually represents a polymer unit having a glass transition temperature, Tg, of 0° C. or higher, and B represents a polymer unit having a glass transition temperature, Tg, of lower than 0° C.

2. The alkali-developable photocurable/thermosetting resin composition according to claim 1, wherein the thermosetting component comprises an epoxy resin.

3. The alkali-developable photocurable/thermosetting resin composition according to claim 1, wherein the carboxyl group-containing photosensitive resin comprises no hydroxyl group.

4. The alkali-developable photocurable/thermosetting resin composition according to claim 1, wherein the carboxyl group-containing photosensitive resin is obtained by a process comprising reacting a resin, which is produced by converting some or all of phenolic hydroxyl groups of a phenol resin to oxyalkyl groups having an alcoholic hydroxyl group, with an α,β-ethylenically unsaturated group-containing monocarboxylic acid, and reacting the resulting reaction product with a polybasic acid anhydride.

5. A photocurable/thermosetting dry film obtained by a process comprising coating and drying the photocurable/thermosetting resin composition according to claim 1 on a carrier film.

6. A cured product obtained by a process comprising curing the photocurable/thermosetting resin composition according to claim 1 by irradiating with an active energy beam, heating, or both.

7. A printed wiring board, comprising:
 the cured product according to claim 6.

8. The alkali-developable photocurable/thermosetting resin composition according to claim 4, wherein the carboxyl group-containing photosensitive resin is obtained by a process comprising reacting a resin, which is produced by converting all of phenolic hydroxyl groups of a phenol resin to oxyalkyl groups having an alcoholic hydroxyl group, with an α,β-ethylenically unsaturated group-containing monocarboxylic acid, and reacting the resulting reaction product with a polybasic acid anhydride.

9. The alkali-developable photocurable/thermosetting resin composition according to claim 2, wherein the carboxyl group-containing photosensitive resin comprises no hydroxyl group.

10. The alkali-developable photocurable/thermosetting resin composition according to claim 2, wherein the carboxyl group-containing photosensitive resin is obtained by a process comprising reacting a resin, which is produced by converting some or all of phenolic hydroxyl groups of a phenol resin to oxyalkyl groups having an alcoholic hydroxyl group, with an α,β-ethylenically unsaturated group-containing monocarboxylic acid, and reacting the resulting reaction product with a polybasic acid anhydride.

11. A photocurable/thermosetting dry film obtained by a process comprising coating and drying the photocurable/thermosetting resin composition according to claim 2 on a carrier film.

12. A cured product obtained by a process comprising curing the photocurable/thermosetting resin composition according to claim 2 by irradiating with an active energy beam, heating, or both.

13. A printed wiring board, comprising:
 the cured product according to claim 12.

14. A cured product obtained by a process comprising curing the photocurable/thermo setting dry film according to claim 5 by irradiating with an active energy beam, heating, or both.

15. A printed wiring board, comprising:
 the cured product according to claim 14.

16. The alkali-developable photocurable/thermosetting resin composition according to claim 1, wherein each A represents polymethylmethacrylate or polystyrene.

17. The alkali-developable photocurable/thermosetting resin composition according to claim 1, wherein B represents poly-n-butylacrylate or polybutadiene.

18. The alkali-developable photocurable/thermosetting resin composition according to claim 1, wherein each A in the block copolymer comprises a unit selected from the group consisting of a styrene unit, a hydroxyl group-containing unit, a carboxyl group-containing unit, an epoxy-containing unit, and an N-substituted acrylamide unit.

19. The alkali-developable photocurable/thermosetting resin composition according to claim 1, wherein the polymer unit of A has Tg of 50° C. or higher, and the polymer unit of B has Tg of −20° C. or lower.

20. The alkali-developable photocurable/thermosetting resin composition according to claim 1, wherein the block copolymer is included in an amount of from 1 to 50 parts by mass based on 100 parts by mass of the carboxyl group-containing photosensitive resin.

* * * * *